(12) United States Patent
Kim

(10) Patent No.: US 10,032,906 B2
(45) Date of Patent: Jul. 24, 2018

(54) VERTICAL FIELD EFFECT TRANSISTOR AND METHOD OF FABRICATING THE SAME

(71) Applicant: SAMSUNG ELECTRONICS CO., LTD., Suwon-si, Gyeonggi-Do (KR)

(72) Inventor: Jin Gyun Kim, Suwon-si (KR)

(73) Assignee: SAMSUNG ELECTRONICS CO., LTD., Suwon-si, Gyeonggi-Do (KR)

(*) Notice: Subject to any disclaimer, the term of this patent is extended or adjusted under 35 U.S.C. 154(b) by 1 day.

(21) Appl. No.: 15/229,881

(22) Filed: Aug. 5, 2016

(65) Prior Publication Data
US 2017/0317211 A1 Nov. 2, 2017

Related U.S. Application Data

(60) Provisional application No. 62/329,577, filed on Apr. 29, 2016, provisional application No. 62/329,524, filed on Apr. 29, 2016.

(51) Int. Cl.
*H01L 29/78* (2006.01)
*H01L 29/66* (2006.01)
(Continued)

(52) U.S. Cl.
CPC ...... *H01L 29/7827* (2013.01); *H01L 21/0217* (2013.01); *H01L 21/31111* (2013.01);
(Continued)

(58) Field of Classification Search
CPC ............. H01L 29/7827; H01L 29/1037; H01L 29/6653; H01L 29/6656; H01L 29/66666;
(Continued)

(56) References Cited

U.S. PATENT DOCUMENTS 6,025,241 A * 2/2000 Lin .................... H01L 29/66507
148/DIG. 147
6,096,598 A * 8/2000 Furukawa ............. G03F 7/0035
257/E21.027
(Continued)

FOREIGN PATENT DOCUMENTS

JP 2007036260 A * 2/2007 ............ H01L 27/115
KR 10-0361392 11/2002
(Continued)

*Primary Examiner* — Earl Taylor
(74) *Attorney, Agent, or Firm* — F. Chau & Associates, LLC

(57) ABSTRACT

The present invention concept relates to vertical field effect transistor and method of fabricating the same. A method of fabricating a vertical field effect transistor is provided as follows. A fin structure having a sidewall is formed on a substrate. A lower spacer, a gate pattern and an upper spacer surround a lower sidewall region, a center sidewall region and an upper sidewall region, respectively. The lower spacer, the gate pattern and the upper spacer are vertically stacked on each other along the sidewall of the fin structure. To form the lower spacer, a preliminary spacer layer is formed to surround the lower sidewall region of the fin structure; a doped region and an undoped region are formed in the preliminary spacer layer by doping partially impurities in the preliminary spacer using a directional doping process; and the undoped region of the preliminary spacer layer is removed so that the doped region of the preliminary spacer layer remains to form the lower spacer.

21 Claims, 26 Drawing Sheets

(51) Int. Cl.
  *H01L 29/10* (2006.01)
  *H01L 21/311* (2006.01)
  *H01L 29/08* (2006.01)
  *H01L 21/02* (2006.01)

(52) U.S. Cl.
  CPC ...... *H01L 29/0847* (2013.01); *H01L 29/1037* (2013.01); *H01L 29/6653* (2013.01); *H01L 29/6656* (2013.01); *H01L 29/66666* (2013.01)

(58) Field of Classification Search
  CPC ........... H01L 29/78642; H01L 29/7802; H01L 21/0217; H01L 21/31111
  See application file for complete search history.

(56) References Cited

U.S. PATENT DOCUMENTS

| | | | | |
|---|---|---|---|---|
| 6,100,172 A * | 8/2000 | Furukawa | ........... | H01L 21/0337 257/E21.038 |
| 6,197,641 B1 * | 3/2001 | Hergenrother | ........ | H01L 29/161 257/E21.41 |
| 6,303,425 B1 * | 10/2001 | Maeda | ..................... | H01L 21/84 257/E21.703 |
| 6,433,382 B1 * | 8/2002 | Orlowski | ........... | G11C 16/0433 257/315 |
| 6,635,536 B2 * | 10/2003 | Shin | .................... | H01L 21/7684 257/E21.507 |
| 6,737,308 B2 * | 5/2004 | Kim | .................. | H01L 21/76897 257/E21.438 |
| 7,405,127 B2 * | 7/2008 | Tews | ................. | H01L 21/28273 257/E21.209 |
| 7,541,239 B2 * | 6/2009 | Curello | ........... | H01L 21/823807 257/311 |
| 7,745,875 B2 * | 6/2010 | Tews | ................. | H01L 21/28273 257/329 |
| 8,154,067 B2 * | 4/2012 | Curello | ........... | H01L 21/823807 257/311 |
| 8,174,060 B2 * | 5/2012 | Curello | ........... | H01L 21/823807 257/311 |
| 8,288,275 B2 * | 10/2012 | Park | .................... | H01L 21/7684 438/597 |
| 8,664,125 B2 * | 3/2014 | Raley | ................ | H01J 37/32192 438/305 |
| 9,054,041 B2 * | 6/2015 | von Kluge | ............ | H01L 21/306 |
| 9,064,812 B2 * | 6/2015 | Kim | .................. | H01L 21/3065 |
| 9,177,780 B2 * | 11/2015 | Or | ..................... | H01L 21/02057 |
| 9,245,769 B2 * | 1/2016 | Or | ......................... | H01L 21/326 |
| 9,640,667 B1 * | 5/2017 | Balakrishnan | .... | H01L 29/42392 |
| 9,647,120 B1 * | 5/2017 | Bi | ......................... | H01L 29/785 |
| 9,653,458 B1 * | 5/2017 | Cheng | ................. | H01L 27/0727 |
| 9,673,199 B1 * | 6/2017 | Anderson | ........... | H01L 27/0924 |
| 9,716,170 B1 * | 7/2017 | Cheng | ................. | H01L 29/7827 |
| 9,722,125 B1 * | 8/2017 | Cheng | ................. | H01L 31/119 |
| 9,728,635 B1 * | 8/2017 | Cheng | ................. | H01L 29/7827 |
| 9,748,381 B1 * | 8/2017 | Bi | ........................ | H01L 29/7827 |
| 9,754,933 B2 * | 9/2017 | Balakrishnan | ...... | H01L 27/0629 |
| 9,761,726 B1 * | 9/2017 | Balakrishnan | ...... | H01L 29/78642 |
| 9,773,913 B1 * | 9/2017 | Balakrishnan | .... | H01L 29/78618 |
| 2007/0004149 A1 * | 1/2007 | Tews | ................. | H01L 21/28273 438/268 |
| 2008/0290406 A1 * | 11/2008 | Tews | ................. | H01L 21/28273 257/330 |
| 2014/0120728 A1 * | 5/2014 | Raley | ................ | H01J 37/32192 438/696 |
| 2016/0049483 A1 * | 2/2016 | Zhang | ............... | H01L 29/66545 257/401 |
| 2017/0278843 A1 * | 9/2017 | Balakrishnan | .. | H01L 21/823487 |

FOREIGN PATENT DOCUMENTS

| | | |
|---|---|---|
| KR | 10-0441682 | 7/2004 |
| KR | 10-0480480 | 3/2005 |
| KR | 10-0608354 | 7/2006 |
| KR | 10-0699813 | 3/2007 |
| KR | 10-0700279 | 3/2007 |
| KR | 10-0909632 | 7/2009 |
| KR | 10-2010-0028434 | 3/2010 |
| KR | 10-1065827 | 9/2011 |
| KR | 10-1225642 | 1/2013 |
| KR | 10-1231251 | 2/2013 |
| KR | 10-2014-0107603 | 9/2014 |
| KR | 10-2015-0060920 | 6/2015 |
| WO | 2008005377 | 1/2008 |
| WO | 2013096031 | 6/2013 |
| WO | 2014055235 | 4/2014 |

* cited by examiner

VERTICAL FIELD EFFECT TRANSISTOR AND METHOD OF FABRICATING THE SAME

CROSS-REFERENCE TO RELATED APPLICATION

This application claims the benefit under 35 U.S.C. § 119(e) to U.S. Provisional Patent Applications No. 62/329,524 and 62/329,577, filed on Apr. 29, 2016 in the United States Patent & Trademark Office, the disclosure of which is incorporated by reference herein in its entirety.

TECHNICAL FIELD

The present inventive concept relates to a vertical field effect transistor and a method of fabricating the same.

DISCUSSION OF RELATED ART

For higher densities in integrated circuit applications, various transistor structures have been proposed and fabrication processes thereof have evolved to reduce the minimum feature sizes of circuit elements such as the gate electrode and source/drain electrodes of transistors.

SUMMARY

According to an exemplary embodiment of the present inventive concept, a method of fabricating a vertical field effect transistor is provided as follows. A fin structure having a sidewall is formed on a substrate. The sidewall includes a lower sidewall region, a center sidewall region and an upper sidewall region. A lower spacer, a gate pattern and an upper spacer surround the lower sidewall region, the center sidewall region and the upper sidewall region, respectively. The lower spacer, the gate pattern and the upper spacer are vertically stacked on each other along the sidewall of the fin structure. To form the lower spacer, a preliminary spacer layer is formed to surround the lower sidewall region of the fin structure; a doped region and an undoped region are formed in the preliminary spacer layer by doping partially impurities in the preliminary spacer layer using a directional doping process; and the undoped region of the preliminary spacer layer is removed so that the doped region of the preliminary spacer layer remains to form the lower spacer.

According to an exemplary embodiment of the present inventive concept, a method of fabricating a vertical field effect transistor is provided as follows. A fin structure having a sidewall is formed on a substrate. A preliminary spacer layer is formed on the sidewall of the fin structure. A lower doped region, an upper doped region and an undoped region are formed in the preliminary spacer layer by using a directional doping process. The undoped region of the preliminary spacer layer covers the sidewall of the fin structure. The lower and upper doped regions cover the substrate and an upper surface of the fin structure, respectively. The upper doped region is removed using a planarization process. The undoped region is removed using an isotropic etching process. After the removing of the undoped region, a trench is formed between the lower sidewall region and the lower doped region. A filler pattern is formed in the trench so that the filler pattern surrounds a lower sidewall region. A gate layer is formed on the filler pattern and the lower doped region so that the gate layer surrounds a center sidewall region of the fin structure. A preliminary upper spacer layer is formed on the gate layer so that the preliminary upper spacer layer surrounds an upper sidewall region of the fin structure. The filler pattern, the gate layer and the preliminary upper spacer layer are vertically stacked on each other along the sidewall of the fin structure.

BRIEF DESCRIPTION OF DRAWINGS

These and other features of the present inventive concept will become more apparent by describing in detail exemplary embodiments thereof with reference to the accompanying drawings of which.

Figure 1:
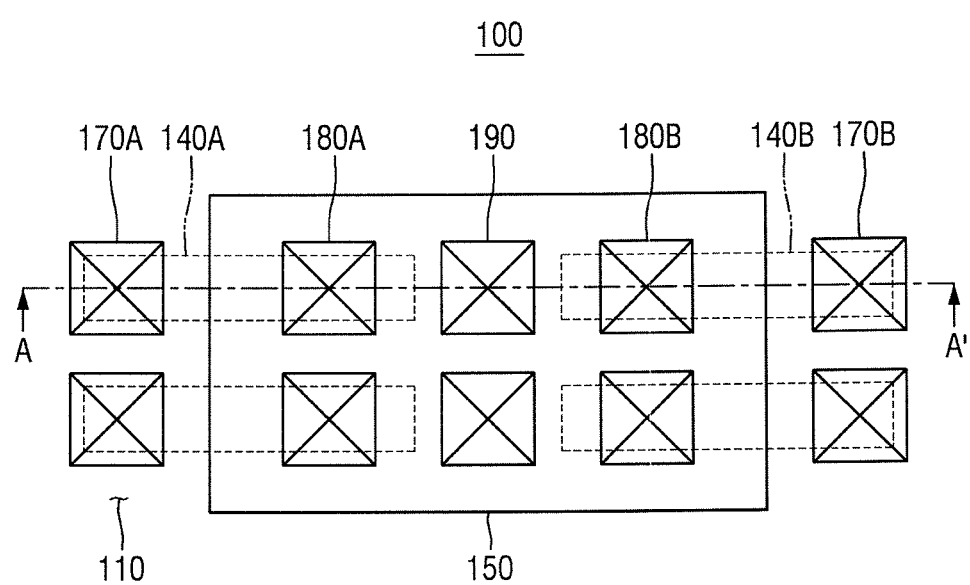
FIG. 1 shows a layout of a vertical fin field effect transistor (V-FinFET) according to an exemplary embodiment of the present inventive concept.

It will be appreciated that for simplicity and clarity of illustration, elements illustrated in the drawings have not necessarily been drawn to scale. For example, the dimensions of some of the elements are exaggerated relative to other elements for clarity. Further, where considered appropriate, reference numerals have been repeated among the drawings to indicate corresponding or analogous elements.

Although corresponding plan views and/or perspective views of some cross-sectional view(s) may not be shown, the cross-sectional view(s) of device structures illustrated herein provide support for a plurality of device structures that extend along two different directions as would be illustrated in a plan view, and/or in three different directions as would be illustrated in a perspective view. The two different directions may or may not be orthogonal to each other. The three different directions may include a third direction that may be orthogonal to the two different directions. The plurality of device structures may be integrated in a same electronic device. For example, when a device structure (e.g., a memory cell structure or a transistor structure) is illustrated in a cross-sectional view, an electronic device may include a plurality of the device structures (e.g., memory cell structures or transistor structures), as would be illustrated by a plan view of the electronic device. The plurality of device structures may be arranged in an array and/or in a two-dimensional pattern.

DETAILED DESCRIPTION OF EXEMPLARY EMBODIMENTS

Exemplary embodiments of the present inventive concept will be described below in detail with reference to the accompanying drawings. However, the inventive concept may be embodied in different forms and should not be construed as limited to the embodiments set forth herein. It will also be understood that when an element is referred to as being "on" another element or substrate, it may be directly on the other element or substrate, or intervening layers may also be present. It will also be understood that when an element is referred to as being "coupled to" or "connected to" another element, it may be directly coupled to or connected to the other element, or intervening elements may also be present.

Figure 2:
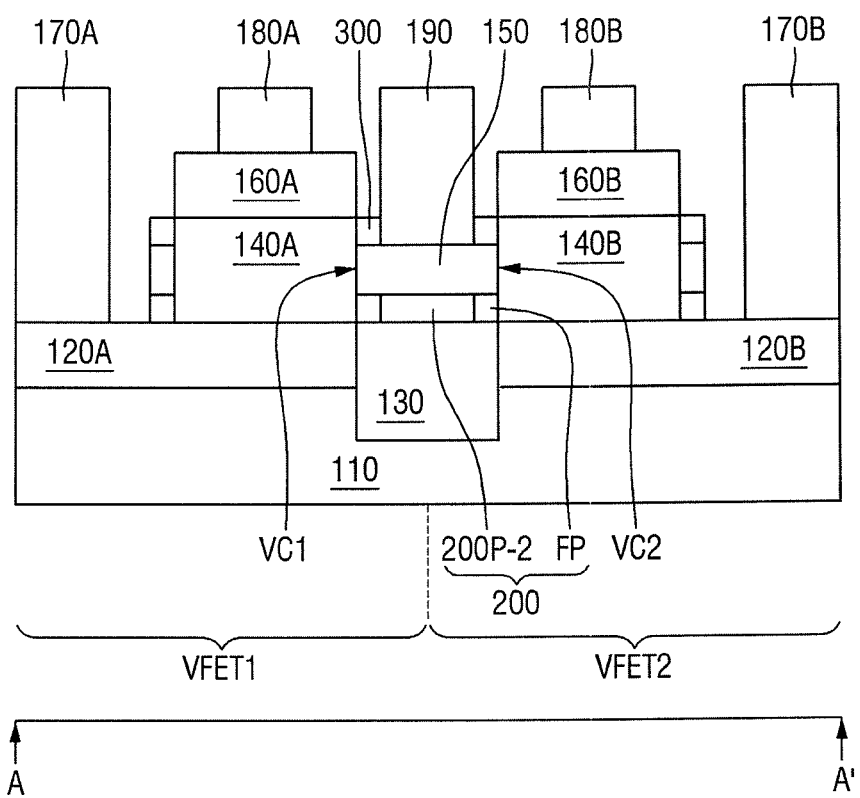
FIG. 2 shows a cross-sectional view taken along line A-A' of FIG. 1.

FIGS. 1 and 2 show a vertical fin field effect transistor (V-FinFET) 100 according to an exemplary embodiment of the present inventive concept. FIG. 1 shows a layout of the V-FinFET 100. FIG. 2 shows a cross-sectional view taken along line A-A' of FIG. 1. The V-FinFET 100 may include a vertical channel disposed in a fin structure 140A between a lower source/drain (S/D) 120A and an upper source/drain (S/D) 160A, for example. The channel length L of the vertical channel may be defined as a distance between a lower surface of an upper spacer 300 and an upper surface of a lower spacer 200.

In FIG. 2, two V-FinFETs VFET1 and VFET2 share a gate pattern 150, a lower spacer 200 and an upper spacer 300. A first V-FinFET VFET1, located at the left of the gate pattern 150, includes a first fin structure 140A, a first lower S/D 120A, and a first upper S/D 160A. The first V-FinFET VFET1 further includes the lower spacer 200, the upper spacer 300 and the gate pattern 150 disposed therebetween. The first fin structure 140A includes a first vertical channel region VC1 defined by the lower spacer 200 and the upper spacer 300. When the first V-FinFET VFET1 is turned on, a channel may be formed in the first vertical channel region VC1. The vertical channel has a channel length L and is a part of the first fin structure 140A overlapped with the gate pattern 150. The channel length L is one of the electrical parameters which determine the performance of the first V-FinFET VFET1. According to an exemplary embodiment, the uniformity of the vertical channel length L among V-FinFETs may be obtained by controlling the thickness of the lower spacer 200 in the fabrication of the V-FinFET 100.

A second V-FinFET VFET2, located at the right of the gate pattern 150, includes a second fin structure 140B, a second lower S/D 120B, and a second upper S/D 160B. The second V-FinFET VFET2 further includes the lower spacer 200, the upper spacer 300 and the gate pattern 150 disposed therebetween. The second fin structure 140B includes a second vertical channel region VC2 defined by the lower spacer 200 and the upper spacer 300. The second vertical channel region VC2 has a channel length L and is a part of the second fin structure 140B overlapped with the gate pattern 150. According to an exemplary embodiment, the uniformity of the vertical channel length L among V-Fin-FETs may be obtained by controlling the thickness of the lower spacer 200 in the fabrication of the V-FinFET 100.

The first V-FinFET VFET1 may include a gate dielectric layer (not shown here) interposed between the gate pattern 150 and the first fin structure 140A. Similarly, the second V-FinFET VFET2 may include a gate dielectric layer (not shown here) interposed between the gate electrode 150 and the second fin structure 140B.

The first and second fin structures 140A and 140B may be formed of silicon or a silicon-germanium alloy. The gate pattern 150 may be formed of doped poly silicon or metal including tungsten or copper. If the gate pattern 150 may be formed of metal, the gate insulating layer may be formed of high-k dielectric insulating material.

The first V-FinFET VFET1 may be an N-type field effect transistor (NFET) and the second V-FinFET VFET2 may be a P-type FET (PFET). The present inventive concept is not limited thereto. For example, the first and second V-FETs VFET1 and VFET2 may be of the same type transistor.

The first V-FinFET VFET1 further includes a first lower S/D electrode 170A, a first upper S/D electrode 180A and a gate electrode 190. The first lower S/D electrode 170A is in contact with the first lower S/D 120A. The first upper S/D electrode 180A is in contact with the first upper S/D 160A. The gate electrode 190 penetrates the upper spacer 300 to be in contact with the gate pattern 150.

The lower spacer 200 includes a filler pattern FP and a doped region 200P-2. The doped region 200P-2 of the lower spacer 200 may include silicon oxide doped with silicon (Si), carbon (C) or nitrogen (N) atoms. The present inventive concept is not limited thereto. For example, the doped region 200P-2 of the lower spacer 200 may include silicon nitride (SiN) doped with carbon (C) atoms, silicon boron nitride (SiBN) doped with carbon (C) atoms or silicon borocarbonitride (SiBCN) doped with carbon (C) atoms.

The filler pattern FP is interposed between the doped region 200P-2 and the first fin structure 140A and between the doped region 200P-2 and the second fin structure 140B. In an exemplary embodiment, the filler pattern FP may include silicon oxide, silicon nitride, silicon boron nitride (SiBN) or silicon borocarbonitride (SiBCN). The filler pattern FP may be formed of the same material with a material of the doped region 200P-2, except that the filler pattern FP is undoped. In this case, the filler pattern FP does not include the impurities doped in the doped region 200P-2. The present inventive concept is not limited thereto. For example, the filler pattern FP may be formed of a different material from a material of the doped region 200P-2. The detailed description of the filler pattern FP will be made with reference to FIGS. 12 and 13.

The lower spacer 200 may include different materials from those of the upper spacer 300. For example, the lower spacer 200 may include the doped region 200P-2 having impurities including silicon (Si), carbon (C) or nitrogen (N) atoms.

Hereinafter, a method of fabricating the V-FinFET 100 including the first V-FinFET VFET1 and the second V-FinFET VFET2 will be described with reference to FIGS. 3 to 17.

Figure 3:
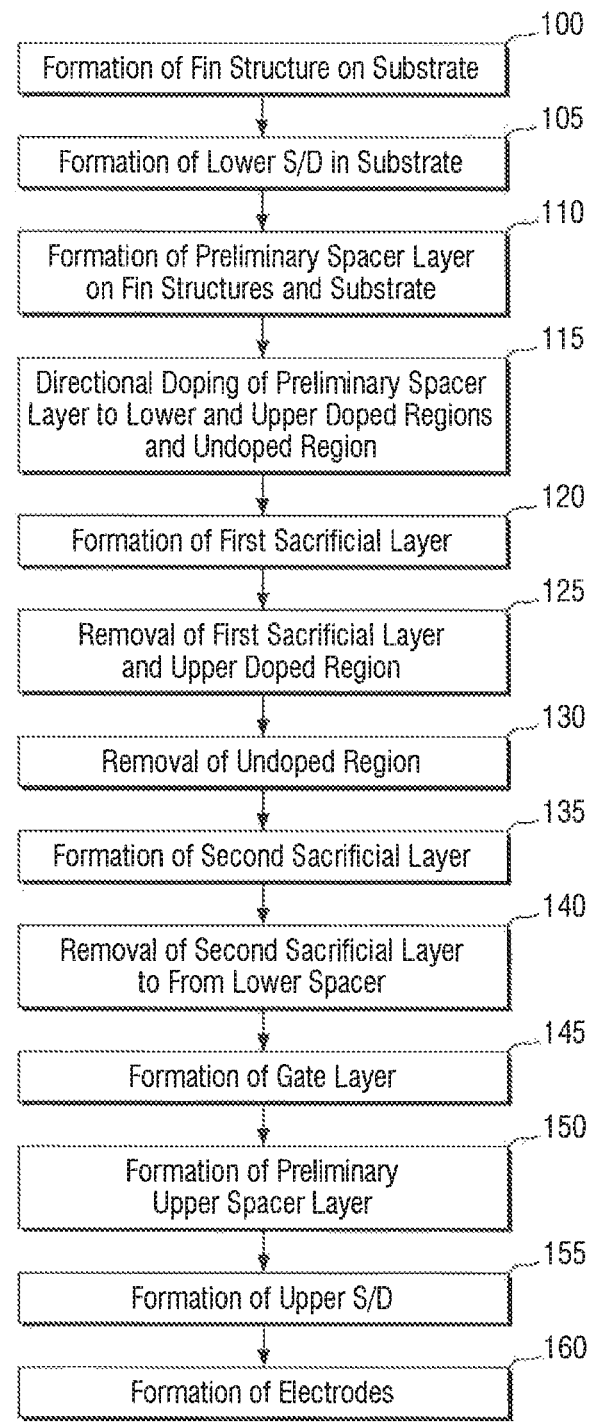
FIG. 3 is a flowchart of fabricating the V-FinFET of FIG. 2 according to an exemplary embodiment of the present inventive concept.

FIG. 3 is a flowchart of fabricating the V-FinFET 100 of FIG. 2 according to an exemplary embodiment of the present inventive concept. FIGS. 4 to 17 show cross-sectional views of the V-FinFET 100 formed according to the flowchart of FIG. 3.

Figure 4:
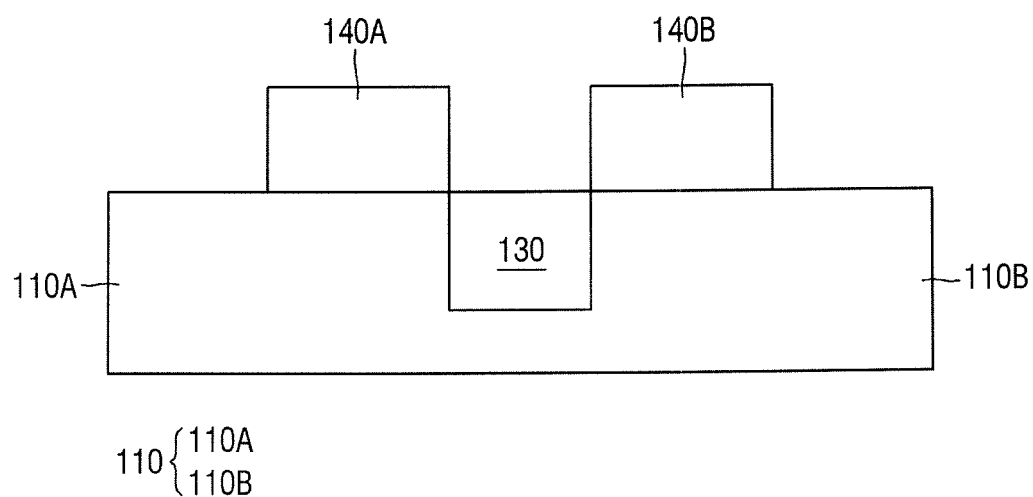
FIGS. 4 to 17 show cross-sectional views of the V-FinFET of FIG. 1 formed according to the flowchart of FIG. 3.

FIG. 4 shows fin structures 140A and 140B formed after step 100 of FIG. 1 is performed according to an exemplary embodiment of the present inventive concept.

The fin structures 140A and 140B may be formed on a substrate 110 using an epitaxial growth process or formed by etching the substrate 110. The substrate 110 includes a first S/D region 110A and a second S/D region 110B defined by an isolation pattern 130. When viewed from the above of the substrate 110, the isolation pattern 130 may surround the first S/D region 110A and the second S/D region 110B so that the first S/D region 110A and the second S/D region 110B are spaced apart from each other.

In an exemplary embodiment, the fin structures 140A and 140B may be formed of polycrystalline silicon, epitaxial silicon or a silicon-germanium alloy.

Figure 5:
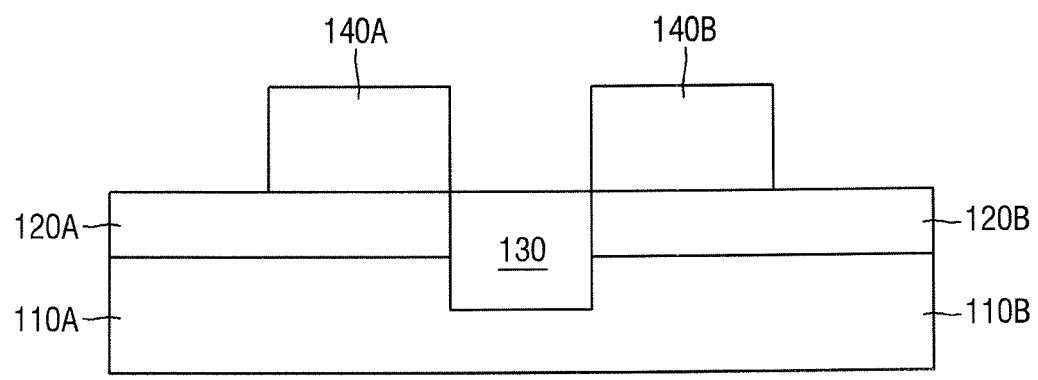

FIG. 5 shows a first lower S/D 120A and a second lower S/D 120B formed after step 105 is performed according to an exemplary embodiment of the present inventive concept. The first lower S/D 120A is formed in the first lower S/D region 110A using a first ion implantation process. The second lower S/D 120B is formed in the second lower S/D region 110B using a second ion implantation process. In an exemplary embodiment where the first V-FinFET VFET1 and the second V-FinFET VFET2 of FIGS. 1 and 2 are different type transistors, the first ion implantation process and the second ion implantation process may be individually performed using different dopants. In an exemplary embodiment where the first V-FinFET VFET1 and the second V-FinFET VFET2 of FIGS. 1 and 2 are the same type transistors, the first and second ion implantation processes may be performed at substantially the same time using the same dopants.

In an exemplary embodiment, the bottom surfaces of the first and second lower S/Ds 120A and 120B are higher than the bottom surface of the isolation pattern 130.

The step 105 may include a heat treatment process to diffuse dopants implanted in the first and second S/D regions 110A and 110B so that the dopants exist in the first and second lower S/D 120A and 120B under the first and second fin structures 140A and 140B.

Figure 6:
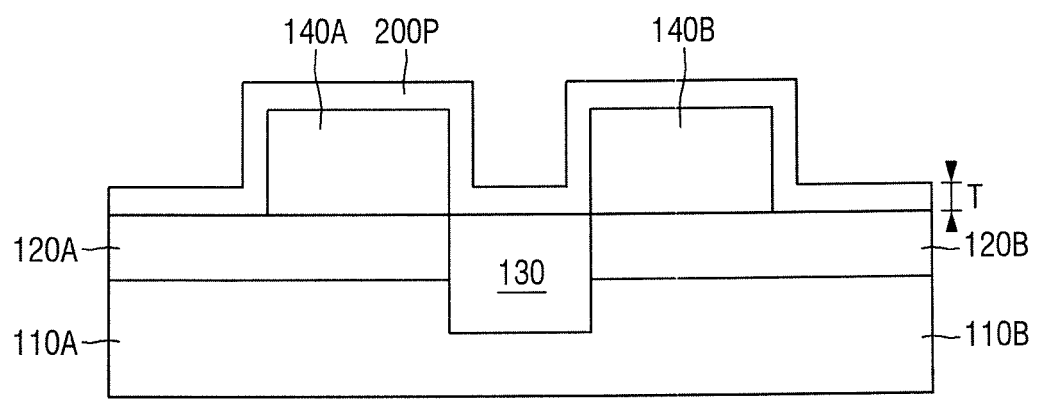

FIG. 6 shows a preliminary spacer layer 200P formed after step 110 is performed according to an exemplary embodiment of the present inventive concept.

The preliminary spacer layer 200P may be formed on the resulting structure of FIG. 5 using a deposition process including a chemical vapor deposition (CVD) process or an atomic layer deposition (ALD) process. The deposition process may be controlled so that the preliminary spacer layer 200P is conformally formed on the resulting structure of FIG. 5 at a target thickness T. The target thickness T of the preliminary spacer layer 200P may be uniform among regions in which V-FinFETs are formed.

The preliminary spacer layer 200P may be formed of an oxide material including silicon oxide ($SiO_2$). The present inventive concept is not limited thereto. For example, the preliminary spacer layer 200P may be formed of a nitride material including silicon nitride (SiN), silicon boron nitride (SiBN), silicon borocarbonitride (SiBCN) or a low-k dielectric material.

Figure 7:
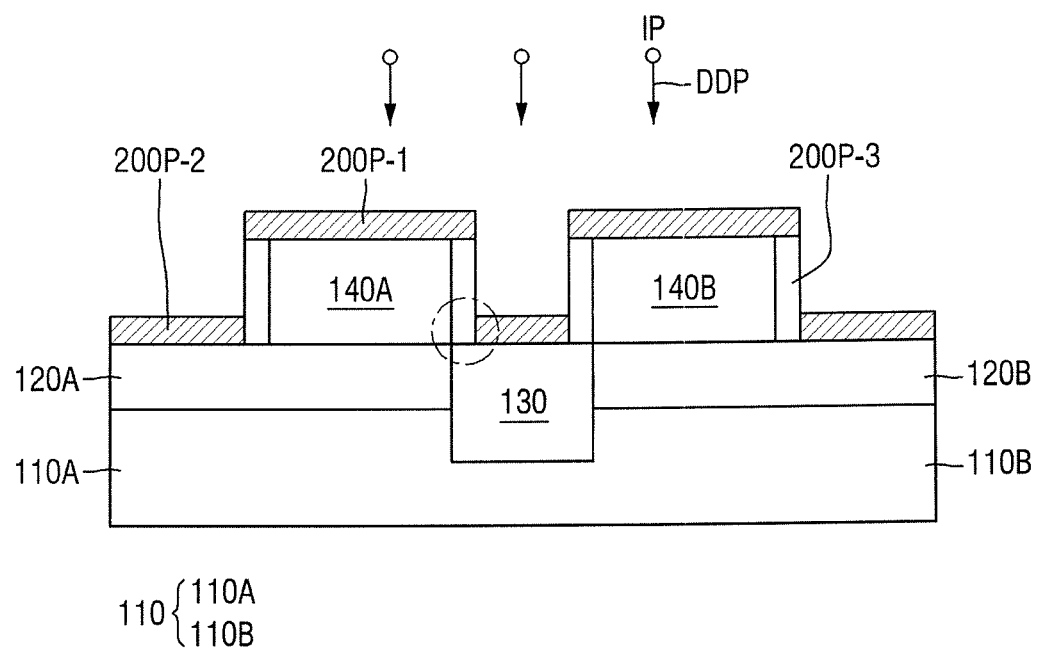

FIG. 7 shows a directional doping process DDP of step 115 performed on the preliminary spacer layer 200P of FIG. 6 according to an exemplary embodiment of the present inventive concept. In the directional doping process DDP, impurities IP are doped in the preliminary spacer layer 200I' so that the preliminary spacer layer 200P includes an upper doped region 200P-1, a lower doped region 200P-2 and an undoped region 200P-3. The preliminary spacer layer 200P may be referred to as a doped preliminary spacer layer.

The undoped region 200P-3 is in contact with sidewalls of the first and second fin structures 140A and 140B. The upper doped region 200P-1 is in contact with upper surfaces of the first and second fin structures 140A and 140B. The lower doped region 200P-2 is in contact with upper surfaces of the first and second lower S/Ds 120A and 120B and an upper surface of the insulation pattern 130.

The directional doping process DDP may be controlled so that impurities IP are implanted in the preliminary spacer layer 200P along a first direction which is perpendicular to the substrate 110. In an exemplary embodiment, the impurities IP may have an angular distribution of incoming impurities to the preliminary spacer layer 200P in the directional doping process DDP. For example, the bottom corner region of the preliminary spacer layer 200P, marked by a dashed circle, may be doped due to the angular distribution of the impurities IP in the directional doping process DDP. Depending on the extent of the angular distribution, the etching profile of the lower doped region 200P-2 may be shown as FIGS. 10 and 11. For example, if the impurities IP have no angular distribution so that the impurities IP are implanted perpendicularly into the preliminary spacer layer 200P, the etching profile of the doped preliminary spacer layer 200P may be shown as FIG. 10. If the impurities IP have a narrow angular distribution to the extent that the impurities are rarely doped in the undoped region 200P-3, the impurities may be implanted on the bottom corner region of FIG. 7 and the etching profile of the doped preliminary spacer layer 200P may be shown as FIG. 11. The slope of a sidewall 200P-2S', as shown in FIG. 11, may depend on the extent of the angular distribution of the impurities. The wider the angular distribution, the smaller the slope of the sidewall 200P-2S' of FIG. 11; the narrower the angular distribution, the grater the slope of the sidewall 200P-2S' of FIG. 11.

The upper and lower doped regions 200P-1 and 200P-2 may have different etching selectivity with respect to the undoped region 200P-3. When the preliminary spacer layer 200P is formed of an oxide material including silicon oxide ($SiO_2$), the impurities IP may include silicon (Si), carbon (C) or nitrogen (N) atoms. When the preliminary spacer layer 200P is formed of a nitride material including silicon nitride (SiN), silicon boron nitride (SiBN) or silicon borocarbonitride (SiBCN), the impurities IP may include carbon (C).

Figure 8:
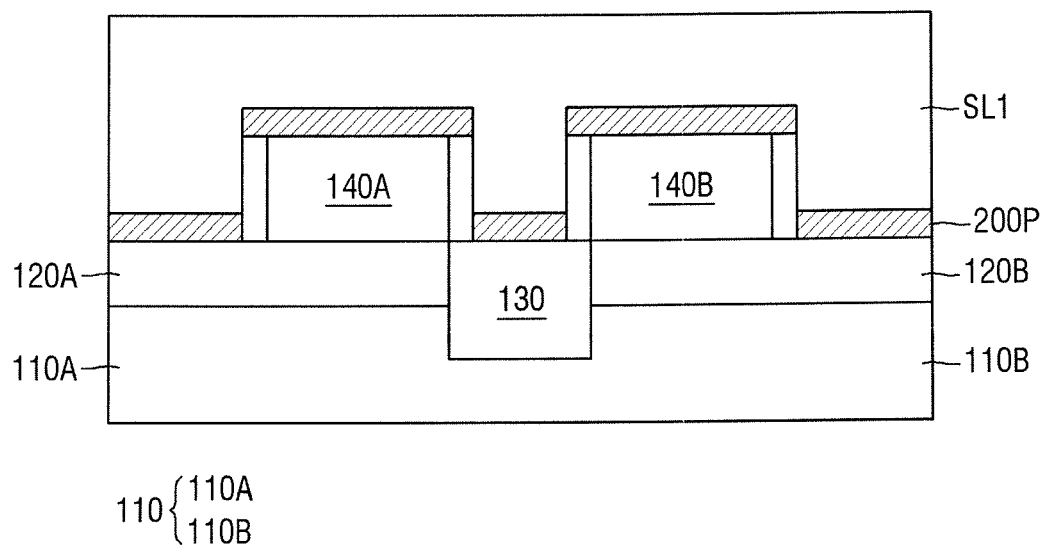

FIG. 8 shows a first sacrificial layer SL1 formed after step 120 according to an exemplary embodiment of the present inventive concept. The first sacrificial layer SL1 may be formed of silicon or amorphous carbon. The present inventive concept is not limited thereto. The material of the first sacrificial layer SL1 may be a material having etch selectivity with respect to the doped preliminary spacer layer 200P in step 125. The first sacrificial layer SL1 covers the doped preliminary spacer layer 200P.

Figure 9:
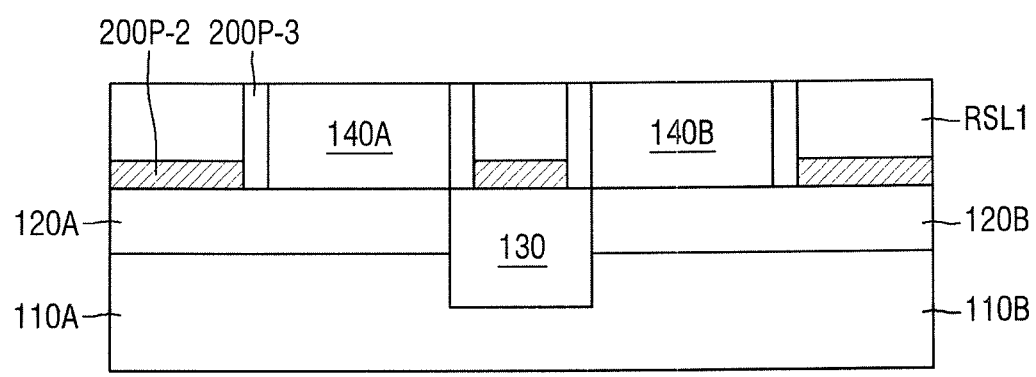

FIG. 9 shows removal of the upper doped region 200P-1 in step 125 according to an exemplary embodiment of the present inventive concept. The removal of the upper doped region 200P-1 may be performed using a planarization process including a chemical mechanical polishing (CMP) process or an etchback process. For example, the upper doped region 200P-1 and the first sacrificial layer SL1 are removed using the CMP process until upper surfaces of the first and second fin structures 140A and 140B are exposed. After the CMP process is completed, the undoped region 200P-3 of the preliminary spacer layer 200P is also exposed and the first sacrificial layer SL1 remains as a recessed first sacrificial layer RSL1.

In an exemplary embodiment, the recessed first sacrificial layer RSL1 may be removed using an etching process so that a sidewall of the undoped region 200P-3 and an upper surface of the lower doped region 200P-2 are exposed.

Figure 10:
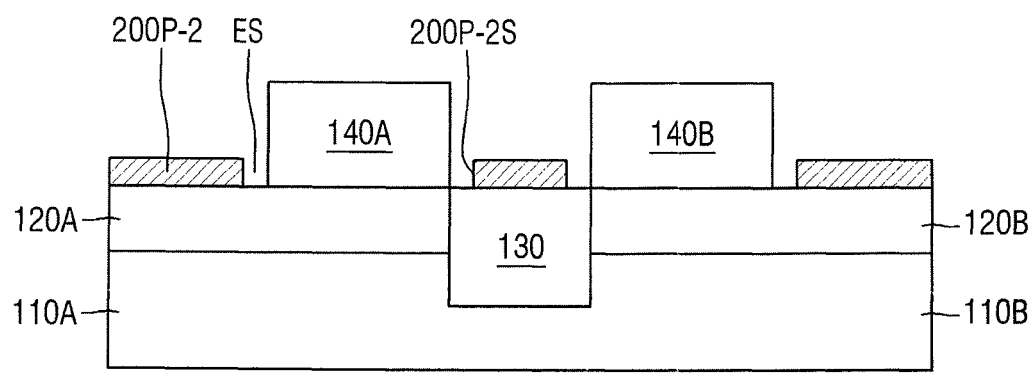
Figure 11:
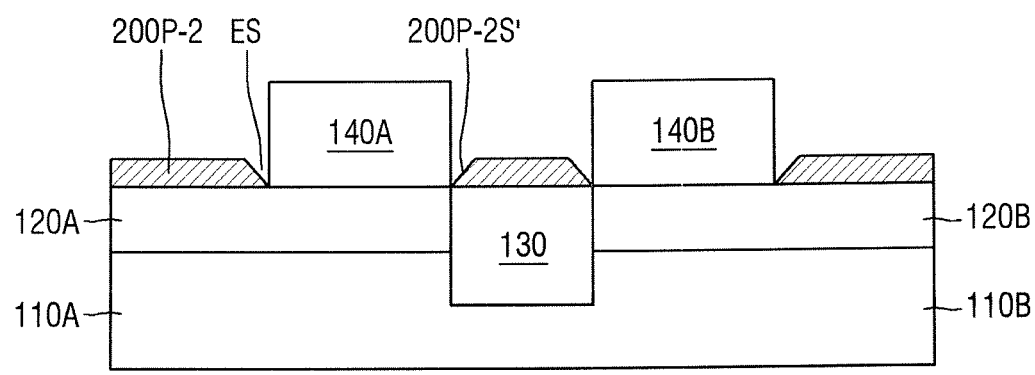

FIGS. 10 and 11 show removal of the undoped region 200P-3 in step 130 according to an exemplary embodiment of the present inventive concept. The removal of the undoped region 200P-3 may be made using an etching process with an etchant having etching selectivity with respect to the lower doped region 200P-2. For example, the undoped region 200P-3 may be removed using an isotropic etching process including a wet etching process or a plasma etching process. When the undoped region 200P-3 is formed of silicon oxide ($SiO_2$), HF may be used as an etchant. For the undoped region 200P-3 formed of silicon nitride, HF or $H_3PO_4$ may be used as an etchant.

In FIGS. 10 and 11, the lower doped region 200P-2 after the undoped region 200P-3 is removed has a sidewall having a different slope. The slope of the sidewall 200P-2S in FIG. 10 is greater than that of the sidewall 200P-2S' in FIG. 11. Depending on the angular distribution of incoming impurities IP in the directional doping process DDP described with reference to FIG. 7, the sidewalls 200P-2S and 200P-2S' are different. The wider the angular distribution, the smaller the slope of the sidewall 200P-2S' of FIG. 11; the narrower the angular distribution, the grater the slope of the sidewall 200P-2S' of FIG. 11.

The removal of the undoped region 200P-3 leaves behind an empty space ES formed between the lower doped region 200P-2 and the first fin structure 140A and between the lower doped region 200P-2 and the second fin structure 140B. The empty space ES may be referred to as a trench.

Figure 12:
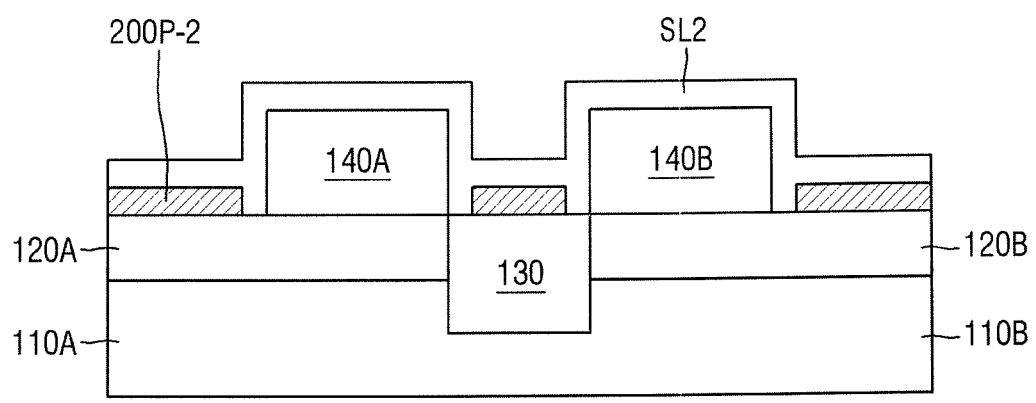

FIG. 12 shows a second sacrificial layer SL2 formed after step 135 is performed according to an exemplary embodiment of the present inventive concept. The second sacrificial layer SL2 may be formed of silicon oxide or silicon nitride.

The formation of the second sacrificial layer SL2 may be performed using a deposition process. In the deposition process, the second sacrificial layer SL2 may be conformally deposited on the resulting structures of FIGS. 10 and 11, filling the trench ES of FIGS. 10 and 11. For the convenience of description, the processes after step 130 may be described with respect to the resulting structure of FIG. 10. According to an exemplary embodiment, the processes after step 130 may be applied to the resulting structure of FIG. 11.

The second sacrificial layer SL2 completely fills the trench ES, covering the lower doped region 200P-1 and the fin structures 140A and 140B.

Figure 13:
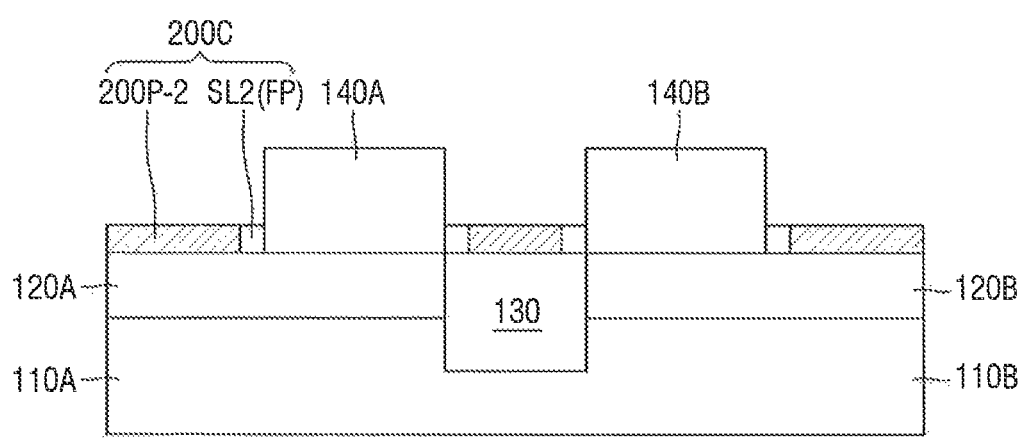

FIG. 13 shows removal of the second sacrificial layer SL2 in step 140 according to an exemplary embodiment of the present inventive concept. The removal of the second sacrificial layer SL2 may be performed using an isotropic etching process to the extent that the sacrificial layer SL2 remains in the trench ES of FIG. 10 between the lower doped region 200P-2 and the first fin structure 140A and between the lower doped region 200P-2 and the second fin structure 140B. The sacrificial layer SL2 that remains in the trench ES may be referred to as the filler pattern FP of FIG. 2.

The filler pattern FP is a remaining portion of the second sacrificial layer SL2 after the second sacrificial layer is isotropically etched. An upper surface of the filler patter FP may be coplanar with an upper surface of the lower doped region 200P-2.

The combined structure of the filler pattern FP and the lower doped region 200P-1 may be referred to as a preliminary lower spacer layer 200C. The preliminary lower spacer layer 200C will be patterned to form the lower spacer 200 of FIG. 2 in a later process.

According to an exemplary embodiment, the preliminary lower spacer layer 200C includes the lower doped region 200P-2 and the filler pattern FP. In this case, impurities of silicon (Si), carbon (C) or nitrogen (N) atoms exist in the doped region 200P-2 while impurities of silicon (Si), carbon (C) or nitrogen (N) atoms do not exist in the filler pattern FP.

Figure 14:
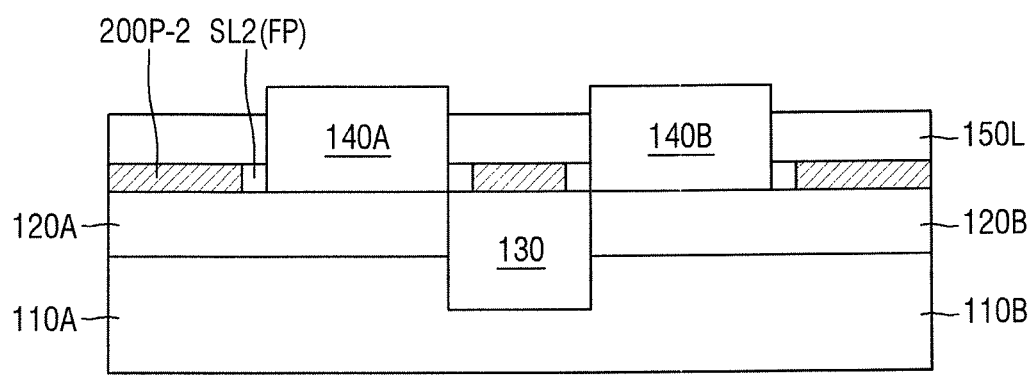

FIG. 14 shows a gate layer 150L formed after step 145 is formed according to an exemplary embodiment of the present inventive concept. The gate layer 150L may include doped poly-silicon or metal including tungsten (W) or copper (Cu). If the gate layer 150L may be formed of metal, a diffusion barrier and/or an adhesion layer (not shown here) may be formed underneath the gate layer 150L.

Figure 15:
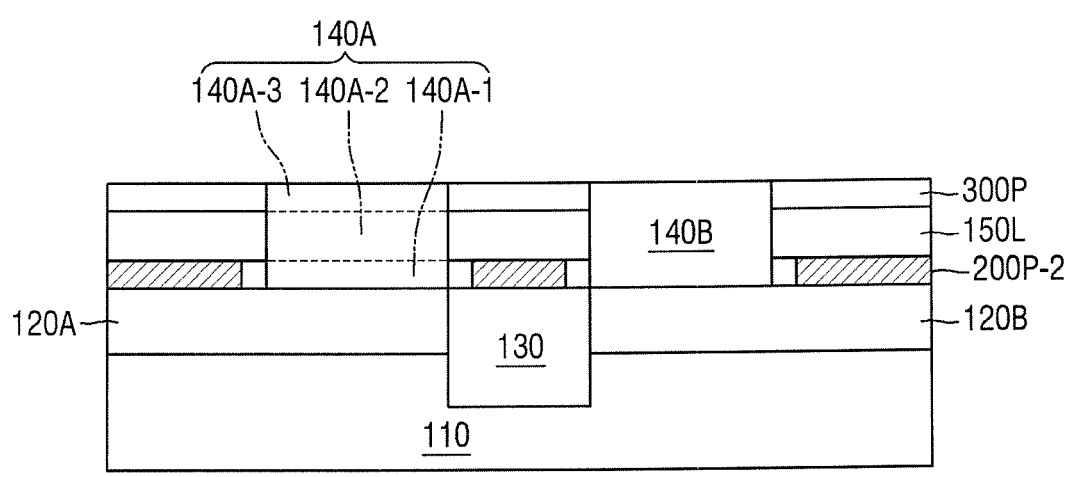

FIG. 15 shows a preliminary upper spacer layer 300P formed after step 150 is performed according to an exemplary embodiment of the present inventive concept.

In an exemplary embodiment, the preliminary upper spacer layer 300P may include silicon oxide or silicon nitride. In an exemplary embodiment, the preliminary upper spacer layer 300P may be formed to cover the upper surfaces of the fin structures 140A and 140B, and then a planarization process including a CMP process or an etchback process may be applied so that the preliminary upper spacer layer 300P has an upper surface coplanar with the upper surfaces of the fin structures 140A and 140B.

In an exemplary embodiment, the fin structures 140A and 140B are surrounded by the preliminary lower spacer layer 200C, the gate layer 150l, and the preliminary upper spacer layer 300P which are stacked vertically along sidewalls of the fin structures 140A and 140B. When viewed from the above of the substrate 110, the preliminary upper spacer layer 300P may surrounds the fin structures 140A and 140B. For example, the preliminary lower spacer layer 200C surrounds a lower sidewall region 140A-1 of the first fin structure 140A; the gate layer 150L surrounds a center sidewall region 140A-2 of the first fin structure 140A; and the preliminary upper spacer layer 300P surrounds an upper sidewall region 140A-3 of the first fin structure 140A. The preliminary lower spacer layer 200C, the gate layer 150L and the preliminary upper spacer layer 300P surrounds the second fin structure 140B in the same manner as described with respect to the first fin structure 140A.

Figure 16:
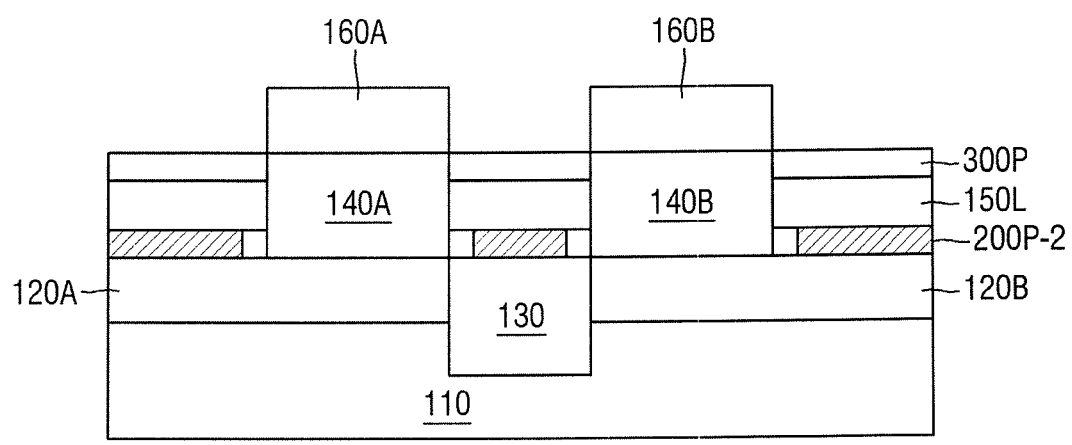

FIG. 16 shows upper S/Ds formed after step 155 is performed according to an exemplary embodiment of the present inventive concept. First and second upper S/Ds 160A and 160B may be epitaxially formed using the upper surfaces of the fin structures 140A and 140B as seed layers. To dope the first and second upper S/Ds 160A and 160B with dopants, an ion implantation process may be performed on the first and second upper S/Ds 160A and 160B. If the first and second V-FinFETs VFET1 and VFET2 of FIG. 2 are of the same type, the ion implantation process may be applied simultaneously to the first and second upper S/Ds 160A and 160B. If the first and second V-FinFETs VFET1 and VFET2 of FIG. 2 are of different types, the ion implantation process may be applied individually to each of the first and second upper S/Ds 160A and 160B.

Figure 17:
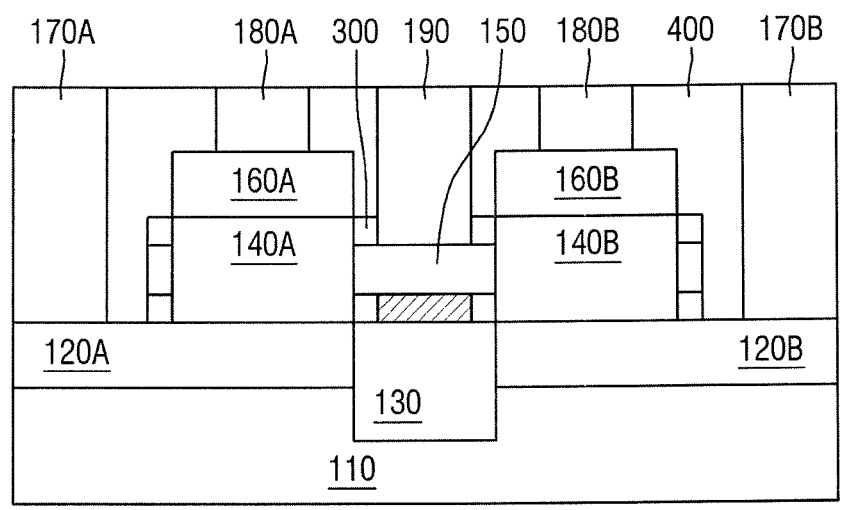

FIG. 17 shows electrodes 170A, 170B, 180A, 180B and 190 formed after step 160 is performed according to an exemplary embodiment of the present inventive concept. The resulting structure of FIG. 16 may be patterned to form a gate pattern 150, a lower spacer 200 and an upper spacer 300 from the gate layer 150L, the preliminary lower spacer layer 200C and the preliminary upper spacer layer 300P of FIG. 16, respectively. After the patterning, an insulating layer 400 may be formed to cover the gate pattern 150, the lower and upper spacers 200 and 300, and the lower and upper S/Ds 120A, 120B, 160A and 160B. Contact holes may be formed through the insulating layer 400 to expose the lower and upper S/Ds 120A, 120B, 160A and 160B. The electrodes 170A, 170B, 180A and 180B are formed within the contact holes to be in contact with the lower and upper S/Ds 120A, 120B, 160A and 160B, respectively. Another contact hole may be formed through the insulating layer 400 and the upper spacer 300 to expose the gate pattern 150. A common gate electrode 190 is formed within the another contact hole to be in contact with the gate pattern 150.

In an exemplary embodiment, the patterning of the preliminary lower spacer layer 200C, the gate layer 150L and the preliminary upper spacer layer 300P may be performed before the formation of the upper S/Ds 160A and 160B.

Hereinafter, a V-FinFET 100' including a first V-FinFET VFET1' and a second V-FinFET VFET2' and a method of fabricating the V-FinFET 100' including the first V-FinFET VFET1' and the second V-FinFET VFET2' will be described with reference to FIGS. 18 to 22.

Figure 18:
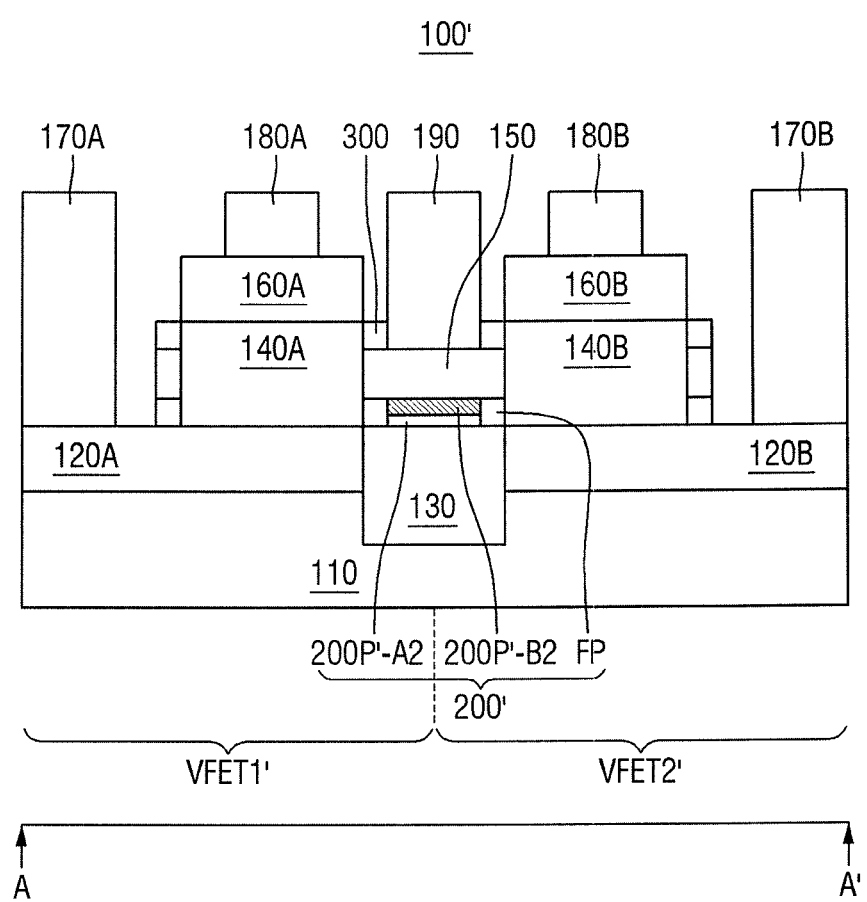
FIG. 18 shows a cross-sectional view of a V-FinFET taken along line A-A' of FIG. 1.

FIG. 18 shows a cross-sectional view of the V-FinFET 100' according to an exemplary embodiment of the present inventive concept. The cross-sectional view of the V-FinFET 100' may be taken along line A-A' of FIG. 1. For the convenience of description, description of the same elements as in the above embodiment will be omitted.

The V-FinFET 100' includes an upper spacer 300 and a lower spacer 200'. The lower spacer 200' includes a filler pattern FP, a lower portion 200P'-B2 of a second preliminary spacer layer 200P'-B and a lower portion 200P'-A2 of a first preliminary spacer layer 200P'-A. According to an exemplary embodiment, the lower spacer 200' may have a predetermined thickness which is uniform among V-FinFETs formed simultaneously with the V-FinFET 100' on a substrate 110.

The filler pattern FP may be formed of silicon oxide or silicon nitride; the lower portion 200P'-B2 of the second preliminary spacer layer 200P'-B may be formed of silicon oxide including $SiO_2$ or SiGeO or silicon nitride including SiN, SiGeN or SiON; and the lower portion 200P'-A2 may be formed of SiO2, SiN, SiBCN or SiOCN.

With reference to FIGS. 19-23, a method of fabrication of the V-FinFET 100' of FIG. 18 will be described.

Figure 19:
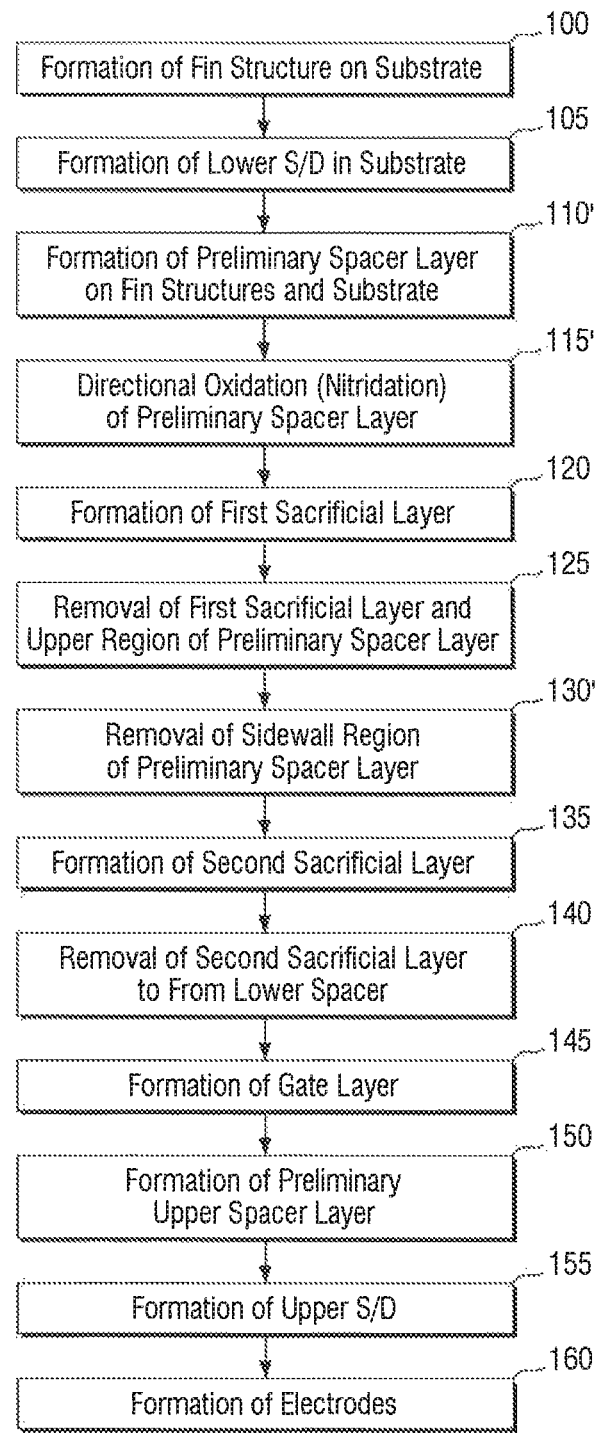
FIG. 19 is a flowchart of fabricating the V-FinFET of FIG. 18 according to an exemplary embodiment of the present inventive concept.

FIG. 19 is a flowchart of fabricating the V-FinFET 100' of FIG. 18 according to an exemplary embodiment of the present inventive concept. FIGS. 20-23 show cross-sectional views of the V-FinFET 100' formed according to the flowchart of FIG. 19. For the convenience of description, the same steps and elements as in the above exemplary embodiment will be omitted.

Figure 20:
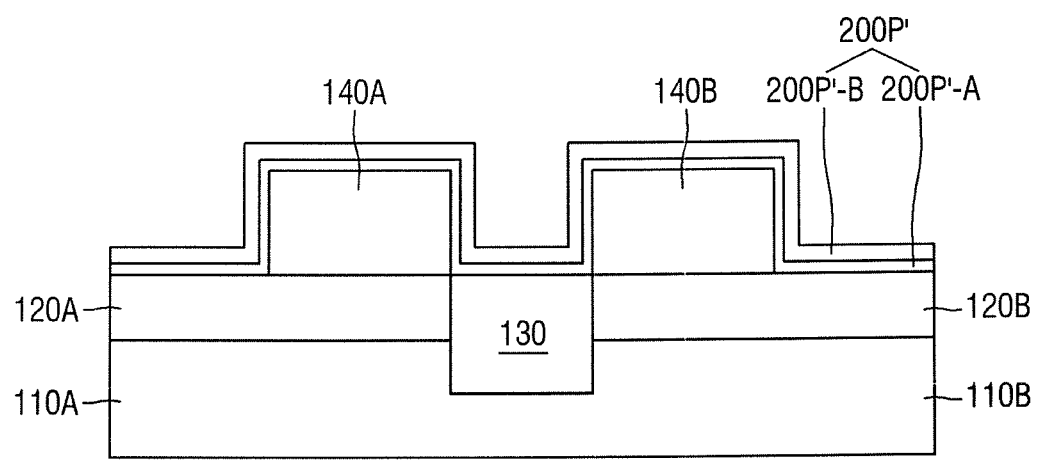
FIGS. 20 to 23 show cross-sectional views of the V-FinFET of FIG. 1 formed according to the flowchart of FIG. 19.

FIG. 20 shows a preliminary spacer layer 200P' formed after step 110' is performed according to an exemplary embodiment. Before the step 110' is performed, steps 100 and 105 of FIG. 19 are performed as described with reference to FIGS. 3 to 5.

The preliminary spacer layer 200P' includes a first preliminary spacer layer 200P'-A and a second preliminary spacer layer 200P'-B. The first preliminary spacer layer 200P'-A is formed on the resulting structure of FIG. 4 formed after step 105 is performed. The first preliminary spacer layer 200P'-A may be formed of $SiO_2$, SiN, SiBCN, or SiOCN deposited by using a CVD process or an ALD process. The thickness of the first preliminary spacer layer 200P'-A may be less than about 1 nanometer (nm).

The second preliminary spacer layer 200P'-B is formed on the first preliminary spacer layer 200P'-A. The second preliminary spacer layer 200P'-B may be formed of Si, SiGe or SiO2 deposited by using a CVD process or an ALD process. The thickness of the second preliminary spacer layer 200P'-B may be about 3 nm to about 6 nm.

Figure 21:
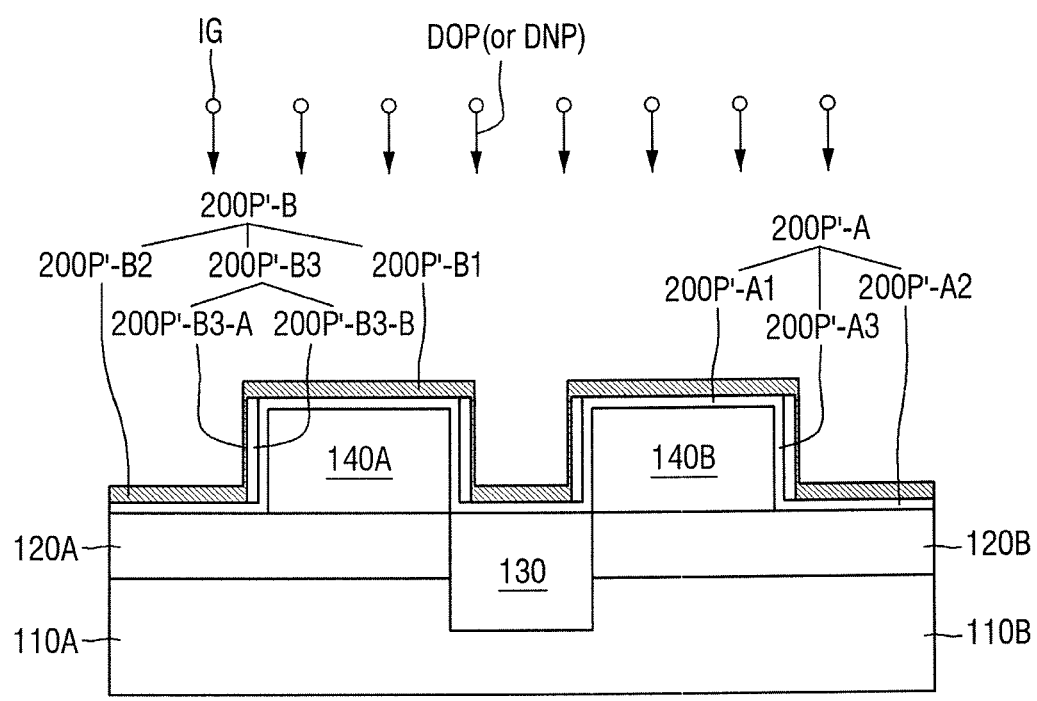

FIG. 21 shows a directional oxidation process DOP in step 115' performed on the preliminary spacer layer 200P' of FIG. 20 according to an exemplary embodiment. The present inventive concept is not limited thereto. For example, a nitridation process may be directionally performed on the preliminary spacer layer 200P' of FIG. 20. The nitridation process may be referred to as a directional nitridation process DNP.

The first preliminary spacer layer 200P'-A includes an upper portion 200P'-A1, a lower portion 200P'-A2 and a center portion 200P'-A3. The first preliminary spacer layer 200P'-A may serve to protect the fin structures 140A and 140B in the directional oxidation process DOP or the directional nitridation process DNP.

In the directional oxidation process DOP, ionized gases IG may impinge on the second preliminary spacer layer 200P'-B in a direction which is perpendicular to the substrate 110 so that an upper region 200P'-B1 of the second preliminary spacer layer 200P'-B and a lower region 200P'-B2 of the second preliminary spacer layer 200P'-B receives more ionized gases IG than a sidewall region 200P'-B3 of the second preliminary spacer layer 200P'-B does. Accordingly, the upper and lower regions 200P'-B1 and 200P'-B2 are thicker than the sidewall region 200P'-B3 due to the difference of the incoming ionized gases IG. For example, the second preliminary spacer layer 200P'-B of FIG. 20 is oxidized in different amounts depending on the regions of the second preliminary spacer layer 200P'-B. The upper and lower regions 200P'-B1 and 200P'-B2 of the second preliminary spacer layer 200P'-13 may be fully oxidized and the sidewall region 200P'-B3 may be partially oxidized so that the sidewall region 200P'-B3 includes an oxidized portion 200P'-B3-A and a remaining portion 200P'-B3-B.

The directional oxidation process DOP may include ionized oxygen gases as the ionized gases IG, wherein the ionized oxygen gases are the products obtained by ionizing the oxygen. The ionized oxygen gases IG may have the directionality by a substrate bias or may be collimated to have the directionality to the substrate 110. A biased plasma process using a substrate bias may be applied or a gas cluster ion beam (GCIB) process using collimated ionized gases may be applied for the directional oxidation process DOP.

In the directional nitridation process DNP, ionized gases IG may have ionized nitrogen gases including $N_2^+$ or $NF_3^+$ as the ionized gases, wherein the ionized nitrogen gases are the products obtained by ionizing the nitrogen. The ionized nitrogen gases IG may have the directionality by a substrate bias or may be collimated to have the directionality to the substrate 110. A biased plasma process using a substrate bias may be applied or a gas cluster ion beam (GCIB) process using collimated ionized gases may be applied for the directional nitridation process DNP.

In the directional nitridation process DNP, the upper region 200P'-B1 of the second preliminary spacer layer 200P'-B and the lower region 200P'-B2 of the second preliminary spacer layer 200P'-B receives more ionized gases IG than the sidewall region 200P'-B3 of the second preliminary spacer layer 200P'-B does. Accordingly, the upper and lower regions 200P'-B1 and 200P'-B2 are thicker than the sidewall region 200P'-B3 by difference in the amount of an nitridation reaction. For example, the second preliminary spacer layer 200P'-B of FIG. 20 is nitrided in different amounts depending on the regions of the second preliminary spacer layer 200P'-B. The upper and lower regions 200P'-B1 and 200P'-B2 of the second preliminary spacer layer 200P'-B may be fully nitrided and the sidewall region 200P'-B3 may be partially nitrided so that the sidewall region 200P'-B3 includes a nitrided portion 200P'-B3-A and a remaining portion 200P'-B3-B.

Figure 22:
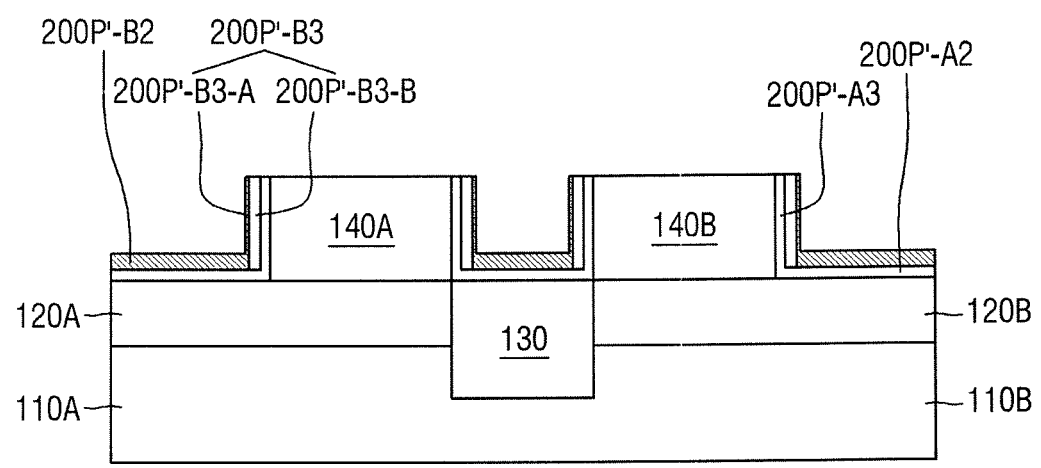

FIG. 22 shows removal of the upper region 200P'-B1 using steps 120 and 125 of FIG. 19 according to an exemplary embodiment of the present inventive concept. Using a planarization process including a CMP process or an etchback process, the upper region 200P'-B1 and the first preliminary spacer layer 200P'-A underneath the upper region 200P'-B1 may be removed until upper surfaces of fin structures 140A and 140B are exposed.

Figure 23:
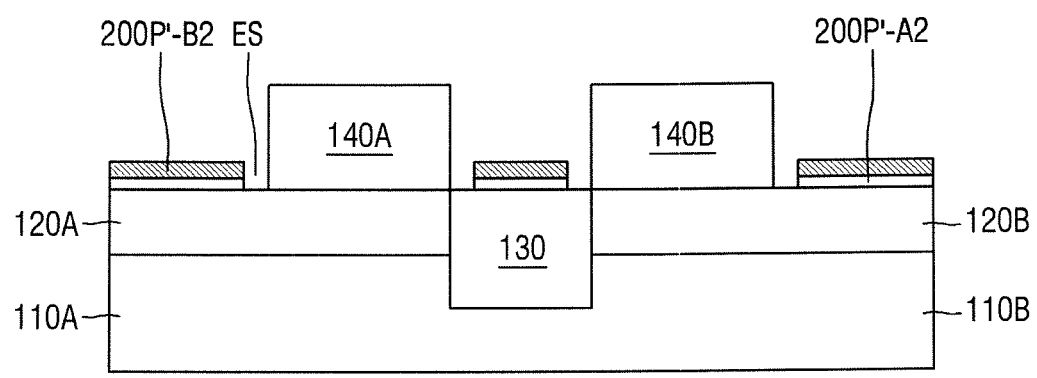

FIG. 23 shows removal of the sidewall region 200P'-B3 in step 130' according to an exemplary embodiment of the present inventive concept.

Using an isotropic etching process including a wet etching process and a plasma etching process, the sidewall region 200P'-B3 is removed. In this case, the removal of the sidewall region 200P'-B3 leaves behind a trench ES between the fin structures 140A and 140B and a combined structure of 200P'-A2 and 200P'-B2. In the etching process, HF or $H_3PO_4$ may be used as etchants to remove silicon oxide or silicon nitride and $CCl_4$ or HCl may be used as etchants to remove the remaining portion 200P'-B3-B formed of Si or SiGe.

Hereafter, the steps 135 to 160 may are applied to the resulting structure of FIG. 21 to form the V-FinFET 100' of FIG. 18.

Figure 24:
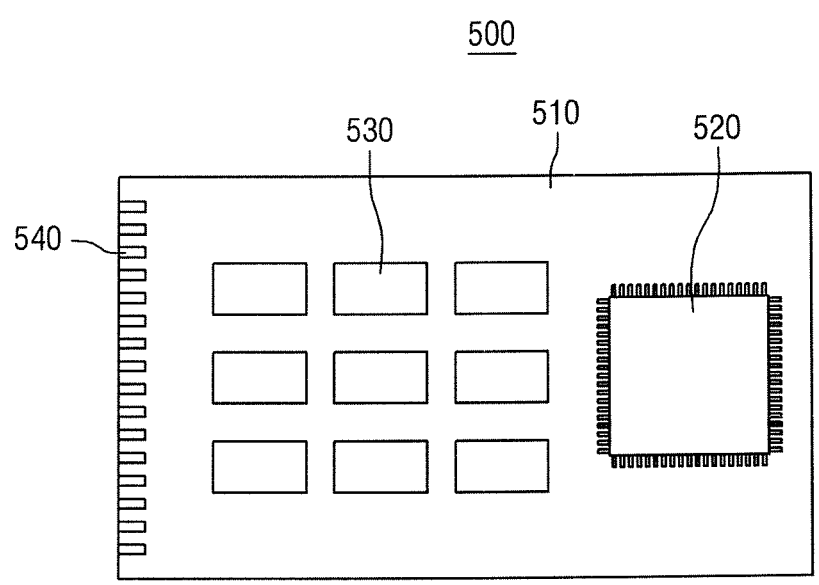
FIG. 24 is a semiconductor module having a V-FinFET fabricated according to an exemplary embodiment of the present inventive concept.

FIG. 24 is a semiconductor module having a V-FinFET fabricated according to an exemplary embodiment of the present inventive concept.

Referring to FIG. 24, the semiconductor module 500 includes a semiconductor device 530 including a V-FinFET. The semiconductor device 530 may be formed according to an exemplary embodiment of the present inventive concept. The semiconductor device 530 is mounted on a semiconductor module substrate 510. The semiconductor module 500 further includes a microprocessor 520 mounted on the semiconductor module substrate 510. Input/output terminals 540 are disposed on at least one side of the semiconductor module substrate 510. The semiconductor module 500 may be included in a memory card or a solid state drive (SSD).

Figure 25:
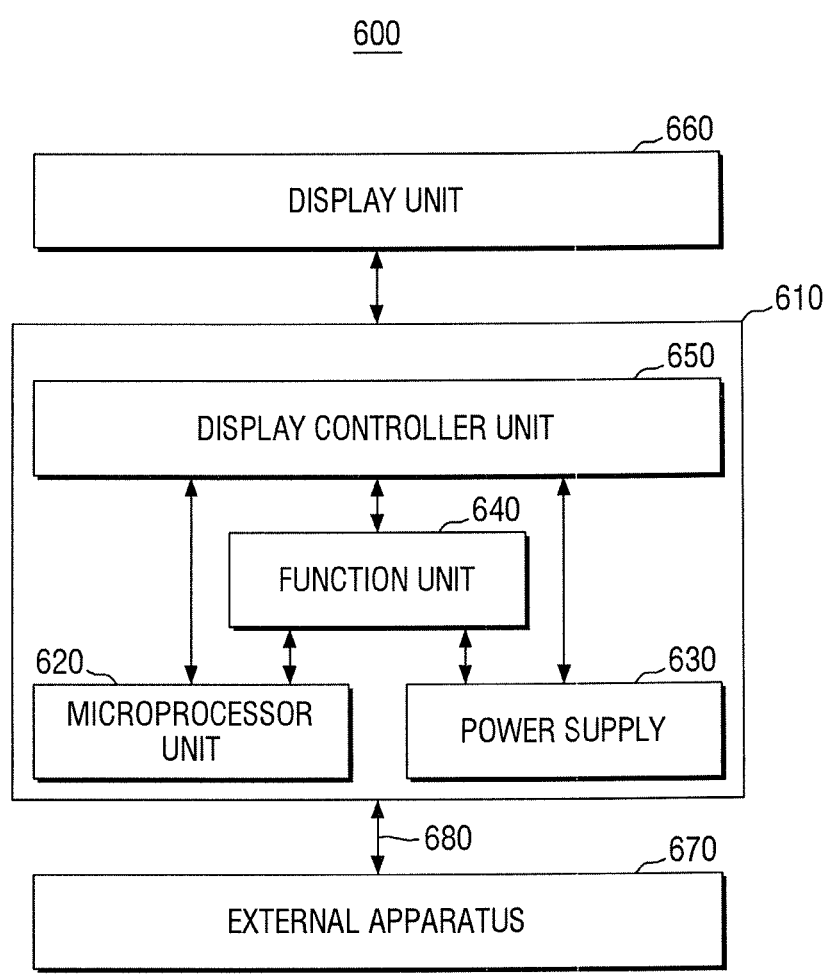
FIG. 25 is a block diagram of an electronic system having a V-FinFET according to an exemplary embodiment of the present inventive concept.

FIG. 25 is a block diagram of an electronic system having a V-FinFET according to an exemplary embodiment of the present inventive concept.

Referring to FIG. 25, a V-FinFET fabricated according to an exemplary embodiment of the present inventive concept may be included in an electronic system 600. The electronic system 600 includes a body 610, a microprocessor unit 620, a power supply 630, a function unit 640, and a display controller unit 650. The body 610 may include a system board or a motherboard having a printed circuit board (PCB) or the like. The microprocessor unit 620, the power supply 630, the function unit 640, and the display controller unit 650 are mounted or disposed on the body 610. A display unit 660 may be stacked on an upper surface of the body 610. For example, the display unit 660 is disposed on a surface of the body 610, displaying an image processed by the display controller unit 650. The power supply 630 receives a constant voltage from an external power supply, generating various voltage levels to supply the voltages to the microprocessor unit 620, the function unit 640, the display controller unit 650, etc. The microprocessor unit 620 receives a voltage from the power supply 630 to control the function unit 640 and the display unit 660. The function unit 640 may perform various functions of the electronic system 600. For example, when the electronic system 600 is a mobile electronic product such as a cellular phone, or the like, the function unit 640 may include various components to perform wireless communication functions such as dialing, video output to the display unit 660 or voice output to a speaker through communication with an external device 670, and when a camera is included, it may serve as an image processor. In an exemplary embodiment, if the electronic system 600 is connected to a memory card to expand the storage capacity, the function unit 640 may serve as a memory card controller. The function unit 640 may exchange signals with the external device 670 through a wired or wireless communication unit 680. Further, when the electronic system 600 requires a Universal Serial Bus (USB) to extend the functions, the function unit 640 may serve as an interface controller. The function unit 640 may include a V-FinFET fabricated according to an exemplary embodiment of the present inventive concept.

Figure 26:
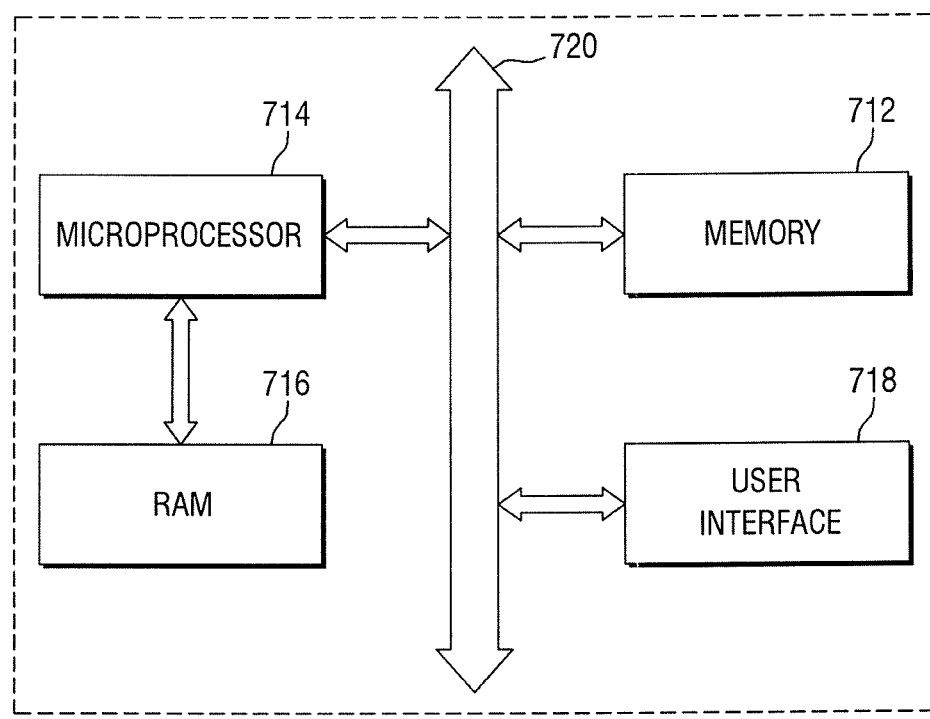
FIG. 26 is a block diagram of an electronic system having a V-FinFET fabricated according to an exemplary embodiment of the present inventive concept.

FIG. 26 is a block diagram of an electronic system having a V-FinFET fabricated according to an exemplary embodiment of the present inventive concept.

Referring to FIG. 26, the electronic system 700 may be included in a mobile device or a computer. For example, the electronic system 700 includes a memory system 712, a microprocessor 714, a random access memory (RAM) 716, and a user interface 718 configured to perform data communication using a bus 720. The microprocessor 714 may program and control the electronic system 700. The RAM 716 may be used as an operational memory of the microprocessor 714. For example, the microprocessor 714 or the RAM 716 may include a V-FinFET fabricated according an exemplary embodiment of the present inventive concept.

The microprocessor 714, the RAM 716, and/or other components may be assembled within a single package. The user interface 718 may be used to input or output data to or from the electronic system 700. The memory system 712 may store operational codes of the microprocessor 714, data processed by the microprocessor 714, or data received from the outside. The memory system 712 may include a controller and a memory.

While the present inventive concept has been shown and described with reference to exemplary embodiments thereof, it will be apparent to those of ordinary skill in the art that various changes in form and detail may be made therein without departing from the spirit and scope of the inventive concept as defined by the following claims.

What is claimed is:

1. A method of fabricating a vertical field effect transistor, comprising:
   forming a fin structure having a sidewall on a substrate, wherein the sidewall includes a lower sidewall region, a center sidewall region and an upper sidewall region;
   forming a lower spacer, a gate pattern and an upper spacer surrounding the lower sidewall region, the center sidewall region and the upper sidewall region, respectively;
   wherein the lower spacer, the gate pattern and the upper spacer are vertically stacked on each other along the sidewall of the fin structure, and
   wherein the forming of the lower spacer includes:
   forming a preliminary spacer layer surrounding the lower sidewall region of the fin structure;
   forming a doped region and an undoped region in the preliminary spacer layer by doping partially impurities in the preliminary spacer layer using a directional doping process; and
   removing the undoped region of the preliminary spacer layer so that the doped region of the preliminary spacer layer remains to form the lower spacer.

2. The method of claim 1,
   wherein the undoped region of the preliminary spacer layer is in contact with the sidewall of the fin structure, and
   wherein the doped region includes an upper doped region which is in contact with an upper surface of the fin structure and a lower doped region which is in contact with the substrate.

3. The method of claim 2, further comprising:
   forming a first sacrificial layer on the preliminary spacer layer having the doped and undoped regions; and removing a stacked structure of the first sacrificial layer and the upper doped region by using a planarizing process.

4. The method of claim 2, wherein the removing of the undoped region is performed by an isotropic etching process, and wherein after the removing of the undoped region, a trench is formed between the lower sidewall region of the fin structure and the lower doped region of the preliminary spacer layer and surrounds the lower sidewall region.

5. The method of claim 4, further comprising:
forming a second sacrificial layer so that the second sacrificial layer completely fills the trench; and
etching isotropically the second sacrificial layer to form a filler pattern which is interposed between the lower sidewall region of the fin structure and the lower doped region,
wherein the filler pattern is a remaining portion of the second sacrificial layer after the second sacrificial layer is isotropically etched.

6. The method of claim 5, wherein an upper surface of the filler pattern is coplanar with an upper surface of the lower doped region.

7. The method of claim 5, wherein the second sacrificial layer is formed of silicon oxide or silicon nitride.

8. The method of claim 1,
wherein the preliminary spacer layer is formed of silicon oxide, and
wherein the impurities include silicon (Si), carbon (C) or nitrogen (N) atoms.

9. The method of claim 1, wherein the impurities include ionized oxygen gases or ionized nitrogen gases including $N_2^+$ or $NF_3^+$.

10. The method of claim 1,
wherein the preliminary spacer layer is formed of silicon nitride (SiN), silicon boron nitride (SiBN) or silicon borocarbonitride (SiBCN), and
wherein the impurities include carbon (C).

11. The method of claim 1, further comprising:
forming a lower source/drain (S/D) in the substrate so that the lower S/D is in contact with the fin structure; and
forming an upper S/D on an upper surface of the fin structure so that the upper S/D is in contact with the upper surface of the fin structure.

12. The method of claim 11, further comprising:
forming a first S/D electrode on the lower S/D;
forming a second S/D electrode on the upper S/D; and
forming a gate electrode so that the gate electrode penetrates the upper spacer to be in contact with the gate pattern.

13. A method of fabricating a vertical field effect transistor, comprising:
forming a fin structure having a sidewall on a substrate, wherein the sidewall includes a lower sidewall region, a center sidewall region and an upper sidewall region;
forming a preliminary spacer layer on the sidewall of the fin structure;
forming a lower doped region, an upper doped region and an undoped region in the preliminary spacer layer by using a directional doping process, wherein the undoped region of the preliminary spacer layer covers the sidewall of the fin structure and the lower and upper doped regions cover the substrate and an upper surface of the fin structure, respectively;
removing the upper doped region using a planarization process;
removing the undoped region using an isotropic etching process, wherein after the removing of the undoped region, a trench is formed between the lower sidewall region and the lower doped region;
forming a filler pattern in the trench so that the filler pattern surrounds the lower sidewall region;
forming a gate layer on the filler pattern and the lower doped region so that the gate layer surrounds the center sidewall region of the fin structure; and
forming a preliminary upper spacer layer on the gate layer so that the preliminary upper spacer layer surrounds the upper sidewall region of the fin structure,
wherein the filler pattern, the gate layer and the preliminary upper spacer layer are vertically stacked along the sidewall of the fin structure.

14. The method of claim 13, wherein the lower doped region is formed of silicon oxide doped with impurities including silicon (Si), carbon (C) or nitrogen (N) atoms.

15. The method of claim 13, wherein the lower doped region is formed of silicon nitride (SiN) doped with carbon (C) atoms, silicon boron nitride (SiBN) doped with carbon (C) atoms or silicon borocarbonitride (SiBCN) doped with carbon (C) atoms.

16. The method of claim 13, wherein the impurities include ionized oxygen gases or ionized nitrogen gases including $N_2^+$ or $NF_3^+$.

17. A vertical field effect transistor, comprising:
a fin structure having a sidewall on a substrate, wherein the sidewall includes a lower sidewall region, a center sidewall region and an upper sidewall region;
a lower spacer surrounding the lower sidewall region of the fin structure;
a gate pattern surrounding the center sidewall region of the fin structure;
an upper spacer surrounding the upper sidewall region of the fin structure,
wherein the lower spacer includes a different material from a material of the upper spacer,
wherein the lower spacer, the gate pattern and the upper spacer are stacked vertically along the sidewall of the fin structure, and
wherein the lower spacer includes a filler pattern and a doped region.

18. The vertical field effect transistor of claim 17, wherein the filler pattern is interposed between the doped region of the lower spacer and the lower sidewall region of the fin structure.

19. The vertical field effect transistor of claim 17, wherein the different material includes impurities of silicon (Si), carbon (C) or nitrogen (N) atoms.

20. The vertical field effect transistor of claim 17, further comprising:
a lower S/D disposed in the substrate so that the lower S/D is in contact with a lower surface of the fin structure; and
an upper S/D disposed on an upper surface of the fin structure so that the upper S/D is in contact with the upper surface of the fin structure.

21. The vertical field effect transistor of claim 17, wherein material compositions of the filler pattern and the doped region are different from each other.

* * * * *